(12) United States Patent  
Koike

(10) Patent No.: US 7,205,637 B2  
(45) Date of Patent: Apr. 17, 2007

(54) SEMICONDUCTOR DEVICE WITH A MULTILEVEL INTERCONNECTION CONNECTED TO A GUARD RING AND ALIGNMENT MARK

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/437,658

(22) Filed: May 22, 2006

(65) Prior Publication Data

US 2006/0220254 A1 Oct. 5, 2006

Related U.S. Application Data

(62) Division of application No. 10/731,148, filed on Dec. 10, 2003, now Pat. No. 7,161,231.

(30) Foreign Application Priority Data

Sep. 30, 2003 (JP) ............... 2003-340588

(51) Int. Cl.
 *H01L 23/544* (2006.01)
 *H01L 21/46* (2006.01)

(52) U.S. Cl. .............. 257/620; 257/758; 257/797; 438/462

(58) Field of Classification Search ............... None
 See application file for complete search history.

(56) References Cited

U.S. PATENT DOCUMENTS

| 5,270,255 A | 12/1993 | Wong |
|---|---|---|
| 5,401,691 A | 3/1995 | Caldwell |
| 5,627,110 A | 5/1997 | Lee et al. |
| 5,783,490 A | 7/1998 | Tseng |
| 5,933,744 A | 8/1999 | Chen et al. |
| 5,939,132 A | 8/1999 | Fujii et al. |
| 6,392,300 B1 | 5/2002 | Koike |
| 2005/0140013 A1 | 6/2005 | Ueno |

FOREIGN PATENT DOCUMENTS

| JP | 5-109873 | 4/1993 |
|---|---|---|
| JP | 10-199790 | 7/1998 |
| JP | 2000-150429 | 5/2000 |
| JP | 2001-15403 | 1/2001 |
| JP | 2002-93750 | 3/2002 |

*Primary Examiner*—Alonzo Chambliss
(74) *Attorney, Agent, or Firm*—Oblon, Spivak, McClelland, Maier & Neustadt, P.C.

(57) ABSTRACT

A semiconductor device includes an alignment mark which is arranged adjacent to each corner of a semiconductor chip, and a plug which contacts the alignment mark. The alignment mark is formed by part of the uppermost interconnection layer in a multilevel interconnection which is formed on the semiconductor chip and obtained by stacking low-permittivity insulating layers and interconnection layers. The plug is buried in a contact hole formed in the low-permittivity insulating layer below the alignment mark, and contacts the alignment mark.

4 Claims, 5 Drawing Sheets

SEMICONDUCTOR DEVICE WITH A MULTILEVEL INTERCONNECTION CONNECTED TO A GUARD RING AND ALIGNMENT MARK

CROSS-REFERENCE TO RELATED APPLICATIONS

This application is a divisional of U.S. application Ser. No. 10/731,148, filed Dec. 10, 2003 now U.S. Pat. No. 7,161,231, and is based upon and claims the benefit of priority from the prior Japanese Patent Application No. 2003-340588, filed Sep. 30, 2003, the entire contents of each of which are incorporated herein by reference.

BACKGROUND OF THE INVENTION

1. Field of the Invention

The present invention relates to a semiconductor device which forms an alignment mark or guard ring by using part of the uppermost interconnection in a multilevel interconnection and, more particularly, to a semiconductor device which prevents peeling of a low-permittivity film by using a multilevel interconnection.

2. Description of the Related Art

In recent years, the interconnection pitch decreases along with micropatterning of LSIs, and an increase in the capacitance between interconnections inhibits an increase in the operation speed of LSIs. To solve this problem, a process of reducing the capacitance between interconnections by using a film having a low permittivity (to be also referred to as Low-k: relative dielectric constant of 3.0 or less) as an insulating film between multilevel interconnection layers is becoming popular.

In the use of a low-permittivity film as insulating films between multilevel interconnection layers as described above, the insulating film peels off from the corner of the chip upon dicing the wafer because the low-permittivity film is physically weak. Peeling readily occurs between a low-permittivity interlayer dielectric film and a thin barrier film such as an SiCN film.

BRIEF SUMMARY OF THE INVENTION

According to an aspect of the present invention, there is provided a semiconductor device comprising a semiconductor chip, an alignment mark which is formed by part of an uppermost interconnection layer in a multilevel interconnection that is formed on the semiconductor chip and obtained by stacking low-permittivity insulating layers and interconnection layers, the alignment mark being arranged adjacent to each corner of the semiconductor chip, and a conductive member which is buried in a contact hole formed in the low-permittivity insulating layer below the alignment mark, and contacts the alignment mark.

According to another aspect of the present invention, there is provided a semiconductor device comprising a semiconductor chip, a guard ring which is formed by part of an uppermost interconnection layer in a multilevel interconnection that is formed on the semiconductor chip and obtained by stacking low-permittivity insulating layers and interconnection layers, the guard ring being arranged adjacent to each corner of the semiconductor chip, and a conductive member which is buried in a contact hole formed in the low-permittivity insulating layer below the guard ring, and contacts the guard ring.

According to still another aspect of the present invention, there is provided a semiconductor device comprising a semiconductor chip, a guard ring which is formed by part of an uppermost interconnection layer in a multilevel interconnection that is formed on the semiconductor chip and obtained by stacking low-permittivity insulating layers and interconnection layers, the guard ring being arranged adjacent to each corner of the semiconductor chip, a first conductive member which is buried in a first contact hole formed in the low-permittivity insulating layer below the guard ring, and contacts the guard ring, an alignment mark which is formed by part of the uppermost interconnection layer in the multilevel interconnection, and arranged near at least one corner of the semiconductor chip, and a second conductive member which is buried in a second contact hole formed in the low-permittivity insulating layer below the alignment mark, and contacts the alignment mark.

DETAILED DESCRIPTION OF THE INVENTION

[First Embodiment]

Figure 1:
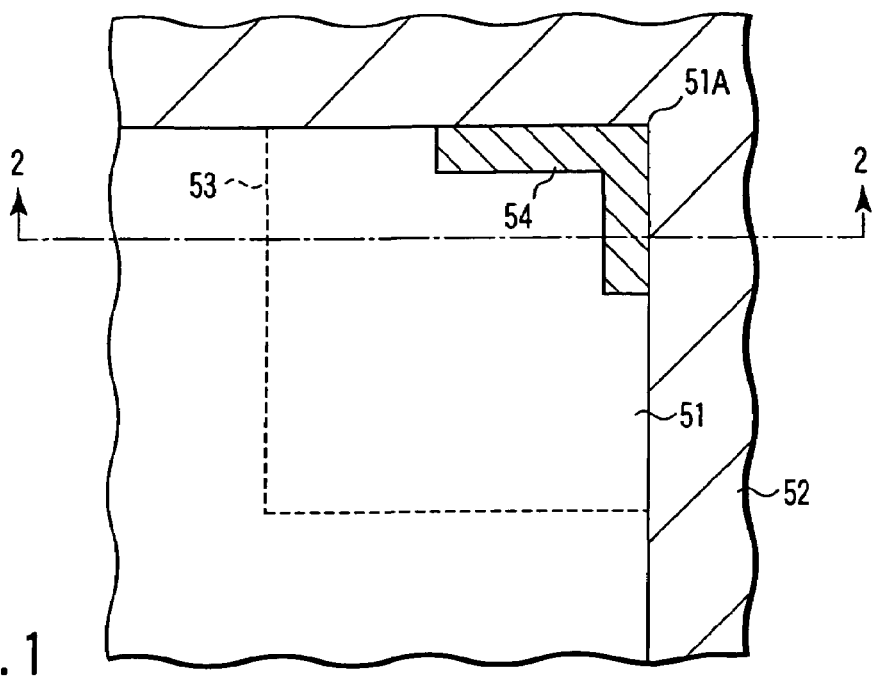
FIG. 1 is an enlarged plan view showing a chip corner in order to explain a semiconductor device according to the first embodiment of the present invention.

FIGS. 1 to 9 are views for explaining a semiconductor device according to the first embodiment of the present invention. FIG. 1 is an enlarged plan view showing the corner of one chip out of many chips formed on a wafer. FIGS. 2 to 9 are sectional views taken along the line 2—2 in FIG. 1. The first embodiment will exemplify a case in which the present invention is applied to a four-layered metal (Cu) interconnection LSI using a low-permittivity film (relative dielectric constant of 3.0 to 2.5) as insulating films between multilevel interconnection layers.

As shown in FIG. 1, a dicing line region 52 is defined along each side of a semiconductor chip 51, and an alignment mark region 53 is defined near a corner (chip end) 51A. An alignment mark 54 formed by the uppermost metal (Cu) interconnection is formed along each side of the chip 51 in the alignment mark region 53. The alignment mark 54 is a pattern obtained by arranging stripes 10 μm or more wide perpendicularly in an L shape at the corner 51A of the chip 51.

A method of manufacturing the semiconductor device shown in FIG. 1 will be described with reference to FIGS. 2 to 9. FIGS. 2 to 9 show a sectional structure taken along the line 2—2 in FIG. 1 in the order of manufacturing steps, respectively.

Figure 2:
FIG. 2 is a sectional view showing the first manufacturing step in order to explain a semiconductor device manufacturing method according to the first embodiment of the present invention.

As shown in FIG. 2, trenches are formed in the major surface of a silicon substrate (semiconductor substrate) 56 serving as the main body of the semiconductor chip 51, and an insulating film is buried in the trenches to form an element isolation region (STI region) 57. A passive element such as a diffusion layer 58 and an active element such as a MOSFET 59 are formed in regions (element regions) other than the element isolation region 57.

Figure 3:
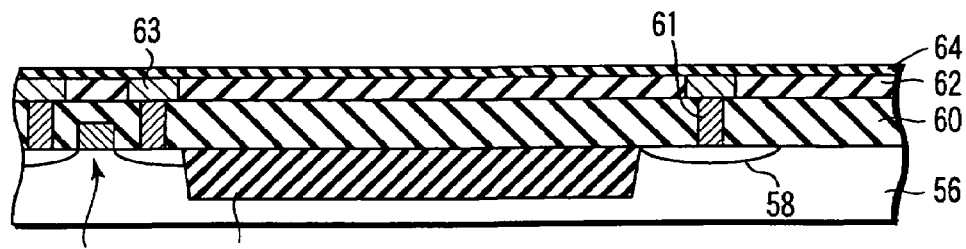
FIG. 3 is a sectional view showing the second manufacturing step in order to explain the semiconductor device manufacturing method according to the first embodiment of the present invention.

As shown in FIG. 3, a first interlayer dielectric film 60 such as a BPSG film is deposited on the substrate 56, and the surface of the first interlayer dielectric film 60 is planarized by CMP. First contact holes are formed in the first interlayer dielectric film 60 by photolithography, and tungsten 61 is buried in the contact holes. A second low-permittivity interlayer dielectric film 62 such as an SiOC film is deposited on the first interlayer dielectric film 60, and selectively etched by photolithography to form first interconnection trenches having a predetermined shape. A first Cu layer 63 is deposited on the entire surface of the second interlayer dielectric film 62, and the surface of the first Cu layer 63 is planarized by CMP. As a result, the first Cu layer 63 is buried in the first interconnection trenches of the second interlayer dielectric film 62. In order to prevent oxidization and diffusion of Cu, a thin barrier film 64 of SiCN or the like is deposited on the second interlayer dielectric film 62 and first Cu layer 63. This is a well-known single damascene step of a Cu interconnection.

Figure 4:
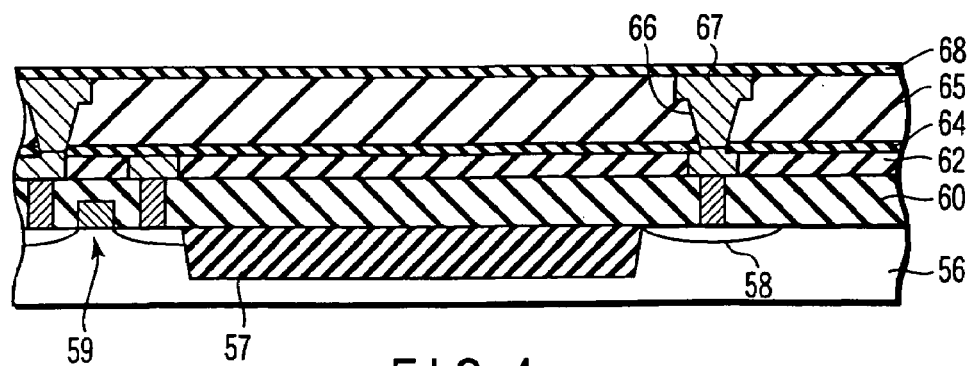
FIG. 4 is a sectional view showing the third manufacturing step in order to explain the semiconductor device manufacturing method according to the first embodiment of the present invention.

As shown in FIG. 4, a third low-permittivity interlayer dielectric film 65 such as an SiOC film is deposited on the barrier film 64, and second contact holes 66 are formed by photolithography. The third interlayer dielectric film 65 is selectively etched by photolithography to form second interconnection trenches having a predetermined shape. A second Cu layer 67 is deposited on the entire surface of the resultant semiconductor structure, and the surface of the second Cu layer 67 is planarized by CMP. As a result, the second Cu layer 67 is buried in the second interconnection trenches of the third interlayer dielectric film 65. In order to prevent oxidization and diffusion of Cu, a thin barrier film 68 such as an SiCN film is deposited on the third interlayer dielectric film 65 and second Cu layer 67. This is a well-known dual damascene step of a Cu interconnection.

Figure 5:
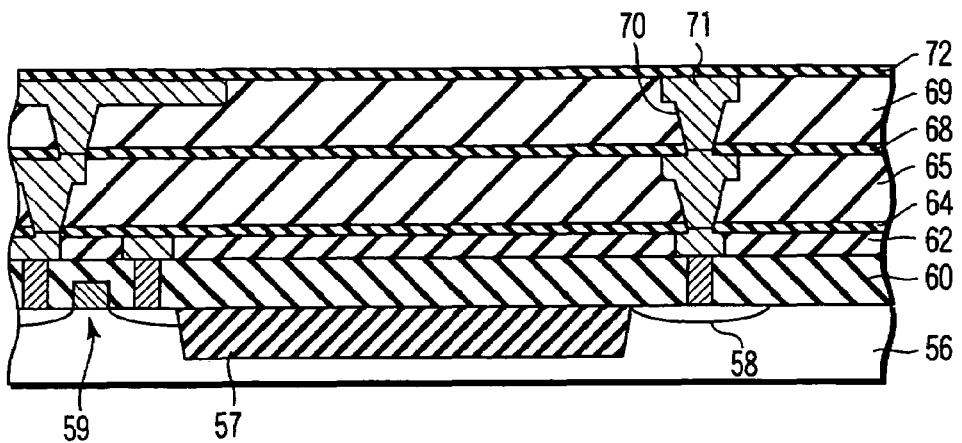
FIG. 5 is a sectional view showing the fourth manufacturing step in order to explain the semiconductor device manufacturing method according to the first embodiment of the present invention.

As shown in FIG. 5, a fourth low-permittivity interlayer dielectric film 69 such as an SiOC film is deposited on the barrier film 68, and third contact holes 70 are formed by photolithography. The fourth interlayer dielectric film 69 is etched by photolithography to form third interconnection trenches having a predetermined shape. A third Cu layer 71 is deposited on the entire surface of the fourth interlayer dielectric film 69, and the surface of the third Cu layer 71 is planarized by CMP. Accordingly, the third Cu layer 71 is buried in the third interconnection trenches of the fourth interlayer dielectric film 69. In order to prevent oxidization and diffusion of Cu, a thin barrier film 72 such as an SiCN film is deposited on the fourth interlayer dielectric film 69 and third Cu layer 71.

Figure 6:
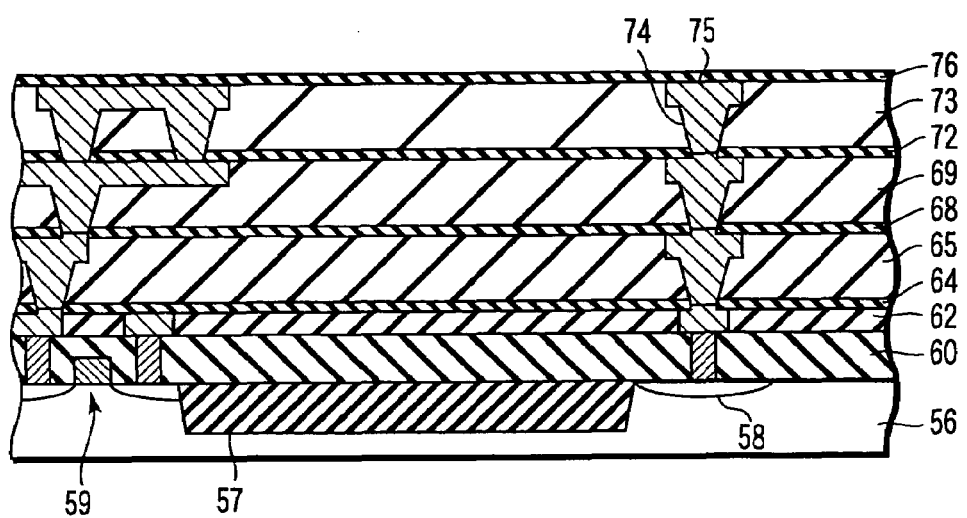
FIG. 6 is a sectional view showing the fifth manufacturing step in order to explain the semiconductor device manufacturing method according to the first embodiment of the present invention.

As shown in FIG. 6, a fifth low-permittivity interlayer dielectric film 73 such as an SiOC film is deposited on the barrier film 72, and fourth contact holes 74 are formed by photolithography. The fifth interlayer dielectric film 73 is selectively etched by photolithography to form fourth interconnection trenches having a predetermined shape. A fourth Cu layer 75 is deposited on the entire surface of the fifth interlayer dielectric film 73, and the surface of the fourth Cu layer 75 is planarized by CMP. Accordingly, the fourth Cu layer 75 is buried in the fourth interconnection trenches of the fifth interlayer dielectric film 73. In order to prevent oxidization and diffusion of Cu, a thin barrier film 76 such as an SiCN film is deposited on the fifth interlayer dielectric film 73. In a four-layered Cu interconnection, an alignment mark and fuse are formed by part of the uppermost fourth Cu layer 75. The fuse is used to switch the circuit connection so as to select, e.g., a spare cell instead of a defective cell. The alignment mark is used for alignment in blowing the fuse.

Figure 7:
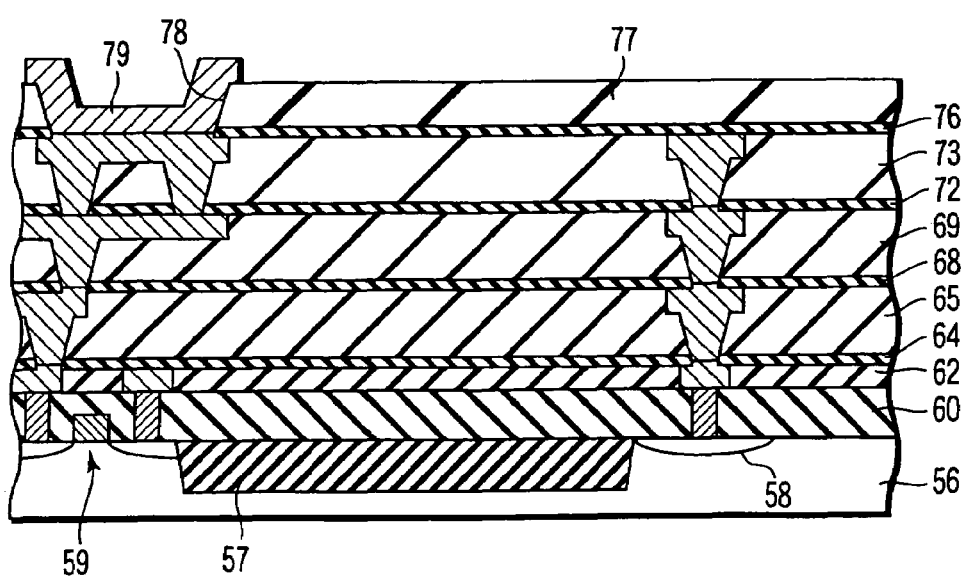
FIG. 7 is a sectional view showing the sixth manufacturing step in order to explain the semiconductor device manufacturing method according to the first embodiment of the present invention.

As shown in FIG. 7, a passivation film 77 such as a PSG film is deposited on the barrier film 76, and the passivation film 77 on the fourth Cu layer 75 serving as a bonding pad is etched away by photolithography. The barrier film 76 is etched to form a through hole 78 for a bonding pad. An Al layer 79 serving as a bonding pad is formed by vapor deposition, and patterned into a predetermined shape by photolithography, thus forming a bonding pad 79.

Figure 8:
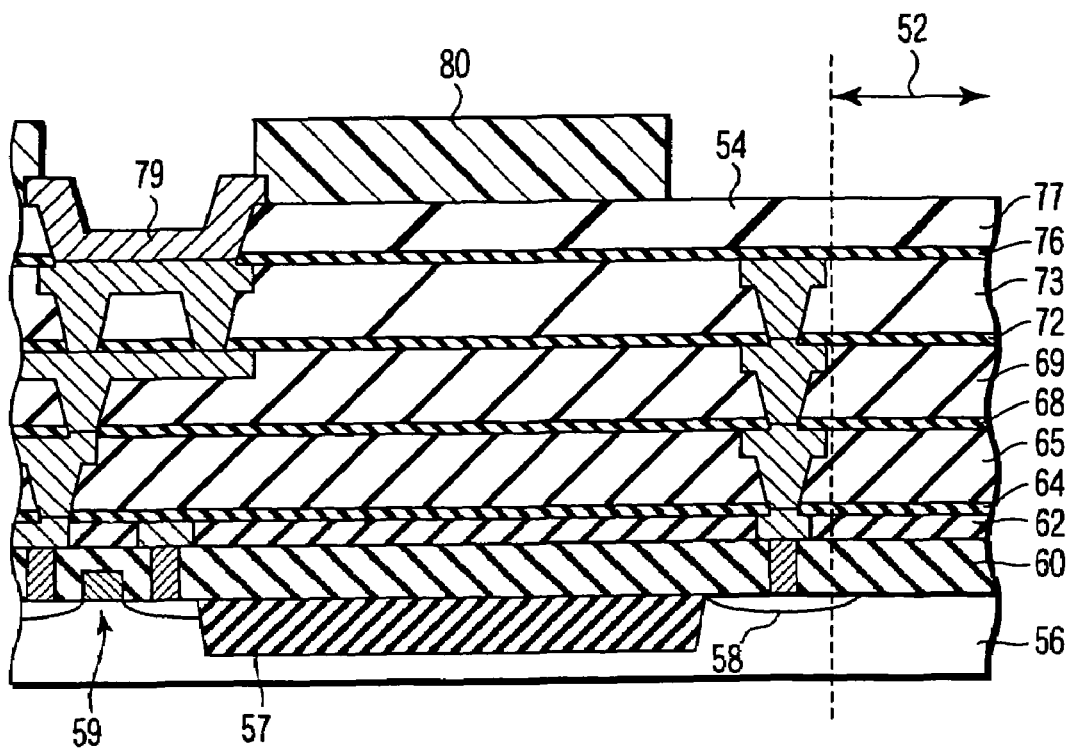
FIG. 8 is a sectional view showing the seventh manufacturing step in order to explain the semiconductor device manufacturing method according to the first embodiment of the present invention.

As shown in FIG. 8, a polyimide layer 80 for protecting the surface is formed on the passivation film 77. The polyimide layer 80 is removed from the bonding pad 79, alignment mark 54, and dicing line region 52 by photolithography.

Figure 9:
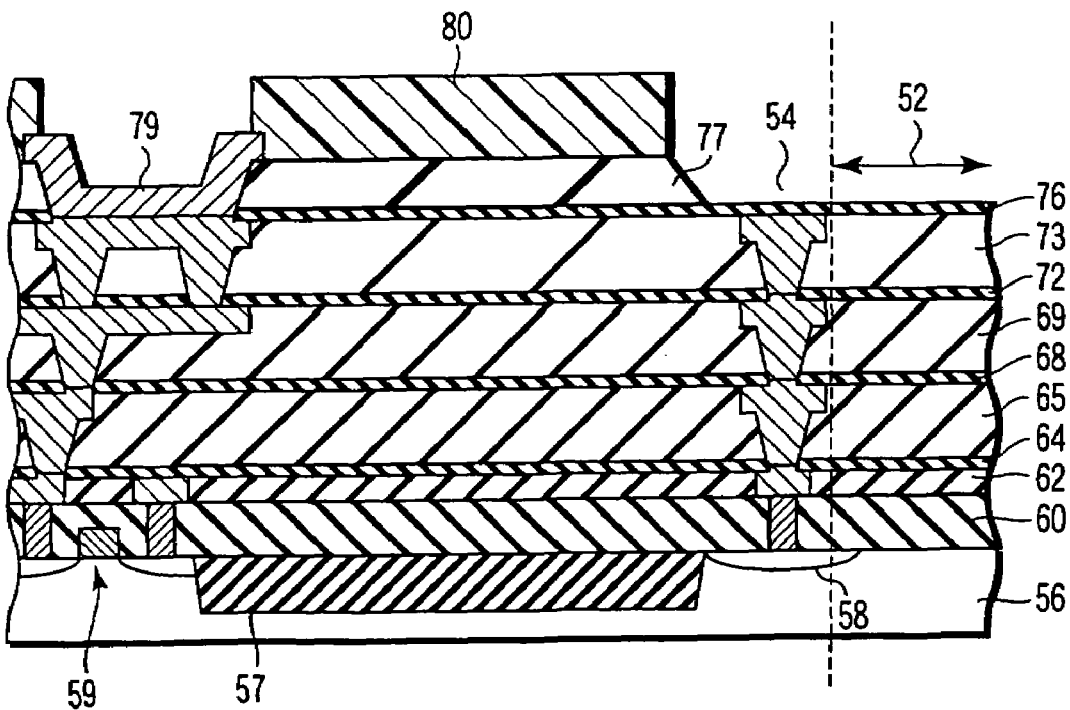
FIG. 9 is a sectional view showing the eighth manufacturing step in order to explain the semiconductor device manufacturing method according to the first embodiment of the present invention.

As shown in FIG. 9, the passivation film 77 is etched by RIE or the like using the polyimide layer 80 as a mask, and a window opening step is performed above the alignment mark 54 and dicing line 52.

According to the technique of the present embodiment, as shown in FIG. 1, the alignment mark 54 is arranged at a position adjacent to the chip end 51A. The distance from the chip end 51A to the alignment mark 54 is substantially 0. As shown in FIG. 9, the alignment mark 54 is arranged at a position adjacent the dicing line 52, and electrically connected to the silicon substrate 56 (diffusion layer 58) via plugs (conductive members) formed by the fourth, third, second, and first Cu layers 75, 71, 67, and 63 and tungsten 61.

In the conventional technique, when a low-permittivity film is used as insulating films between multilevel interconnection layers, it peels off from the chip corner upon dicing the wafer because of its physical weakness. In the technique according to the present embodiment, the alignment mark 54 contacts the dicing line 52, and is connected to the silicon substrate 56 via the lower Cu interconnections (plugs) 75, 71, 67, and 63, physically reinforcing the chip end 51A. This can suppress peeling which readily occurs between the low-permittivity interlayer dielectric films 73, 69, 65, and 62 and the thin barrier films 76, 72, 68, and 64 such as SiCN films. No interlayer dielectric film peels off from the chip corner upon dicing the wafer.

[Second Embodiment]

Figure 10:
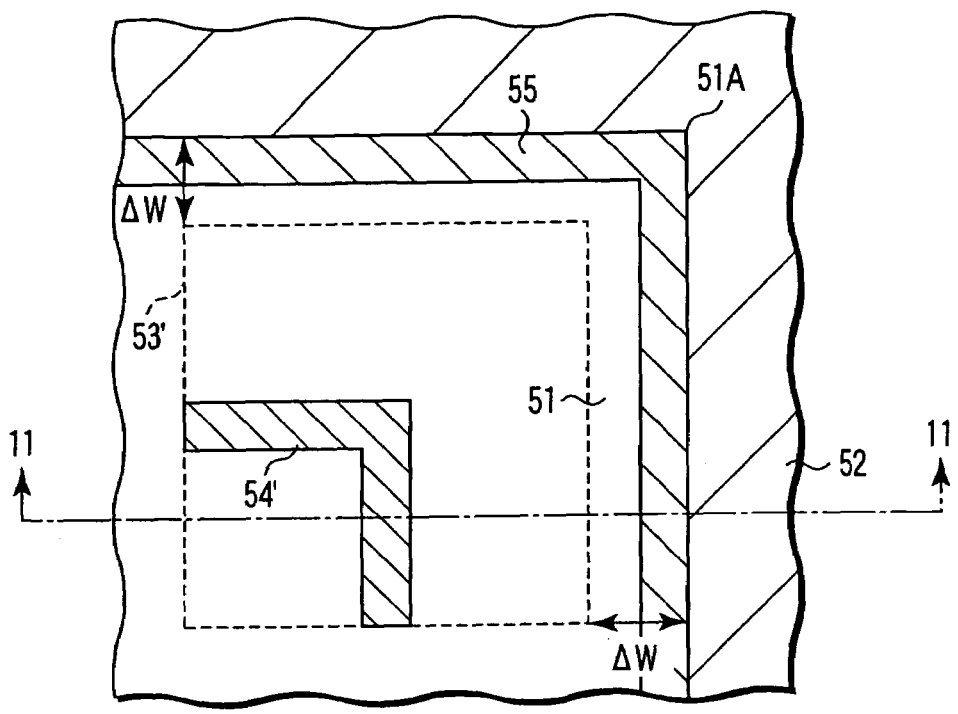
FIG. 10 is an enlarged plan view showing a chip corner in order to explain a semiconductor device according to the second embodiment of the present invention.
Figure 11:
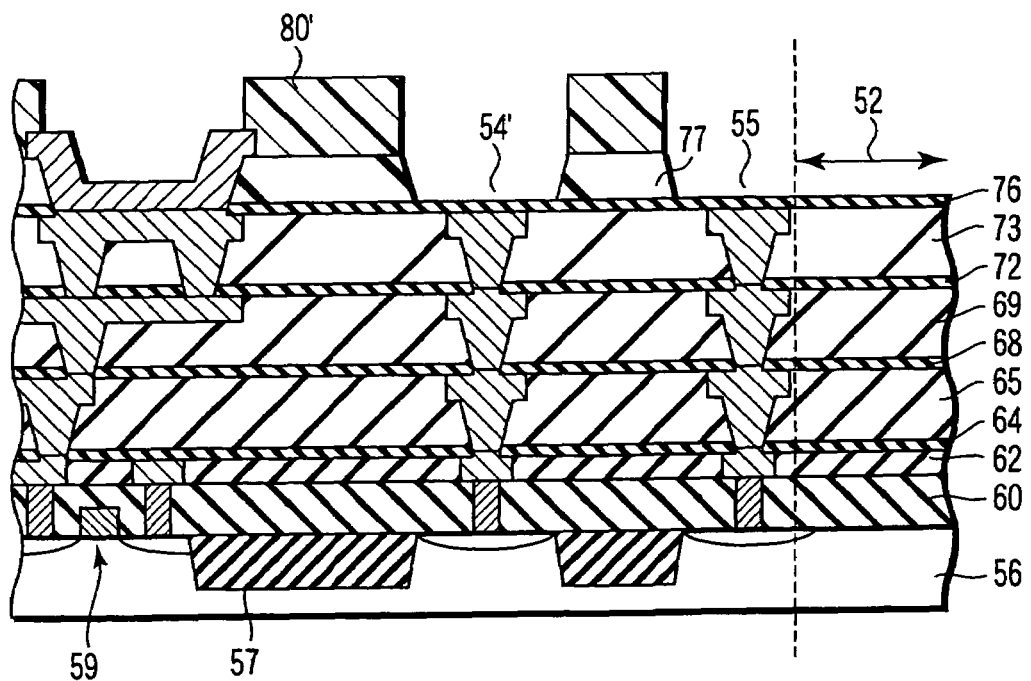
FIG. 11 is a sectional view showing one of manufacturing steps in order to explain a semiconductor device manufacturing method according to the second embodiment of the present invention.

FIGS. 10 and 11 are views for explaining a semiconductor device according to the second embodiment of the present invention. FIG. 10 is an enlarged plan view showing a chip corner. FIG. 11 is a sectional view taken along the line 11—11 in FIG. 10. Similar to the first embodiment, the second embodiment will exemplify a semiconductor device which is applied to a four-layered metal (Cu) interconnection LSI using a low-permittivity film as interlayer dielectric films in a multilevel interconnection.

As shown in FIG. 10, a dicing line region 52 is defined along each side of a chip 51, and a guard ring 55 is formed at a corner (chip end) 51A. The guard ring 55 has a width of 10 μm or more, and is arranged along the four sides of the chip 51. An alignment mark region 53' is defined at an interval ΔW (e.g., 16.5 μm) from each side of the chip 51. An alignment mark 54' formed by the uppermost metal (Cu) interconnection is formed in the alignment mark region 53'.

The chip 51 having the structure as shown in FIG. 10 can be basically formed by executing manufacturing steps as shown in FIGS. 2 to 8, etching a passivation film 77 by RIE or the like using a polyimide layer 80' having a pattern as shown in FIG. 11 as a mask, and executing a window opening step above the alignment mark 54', dicing line 52, and guard ring 55.

The chip 51 formed in this manner has a distance of substantially 0 from the chip corner 51A to the guard ring 55. The guard ring 55 has a distance of substantially 0 from the chip end 51A to the guard ring 55. The guard ring 55 is arranged at a position adjacent to the dicing line 52, and electrically connected to a silicon substrate 56 (diffusion layer) via plugs (conductive members) formed by the fourth to first Cu layers and tungsten.

More specifically, in the first embodiment, the alignment mark 54 is arranged at the chip end 51A. In the second embodiment, the guard ring 55 is arranged along each side of the chip 51 adjacent to the dicing line region 52, and the alignment mark 54' is arranged apart from the chip end 51A. As shown in FIG. 11, the guard ring 55 is connected to the silicon substrate via lower Cu interconnections (plugs), similar to the alignment mark 54 according to the first embodiment.

The remaining basic structure and the manufacturing method shown in FIGS. 2 to 8 are the same as those in the first embodiment, and a detailed description thereof will be omitted.

As described above, according to the second embodiment, the guard ring 55 contacts the dicing line 52, and is connected to the silicon substrate 56 via lower Cu interconnections (plugs) 75, 71, 67, and 63. This can physically suppress peeling which readily occurs between low-permittivity interlayer dielectric films and thin barrier films such as SiCN films. No interlayer dielectric film peels off from the chip corner upon dicing the wafer.

The case in which the guard ring 55 is arranged along the four sides of the chip 51 has been exemplified. The interlayer dielectric film peels off first from the chip corner, and thus the guard ring 55 need not always be arranged along the four sides of the chip 51 as far as the guard ring 55 is arranged at least at each corner.

[Third Embodiment]

Figure 12:
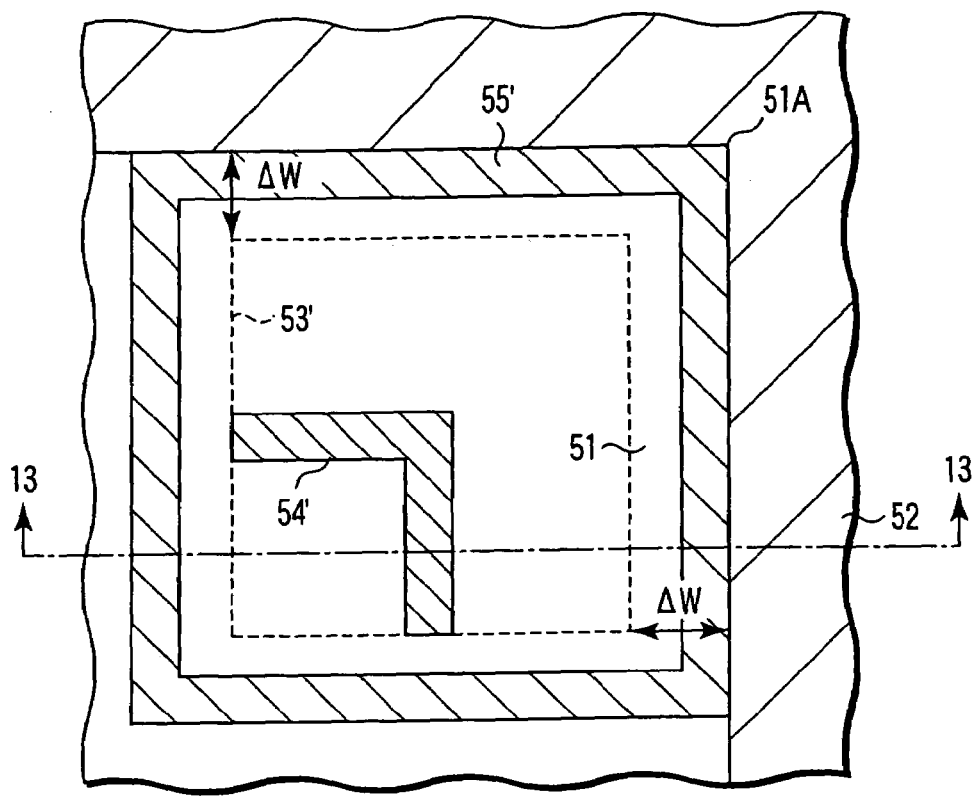
FIG. 12 is an enlarged plan view showing a chip corner in order to explain a semiconductor device according to the third embodiment of the present invention.
Figure 13:
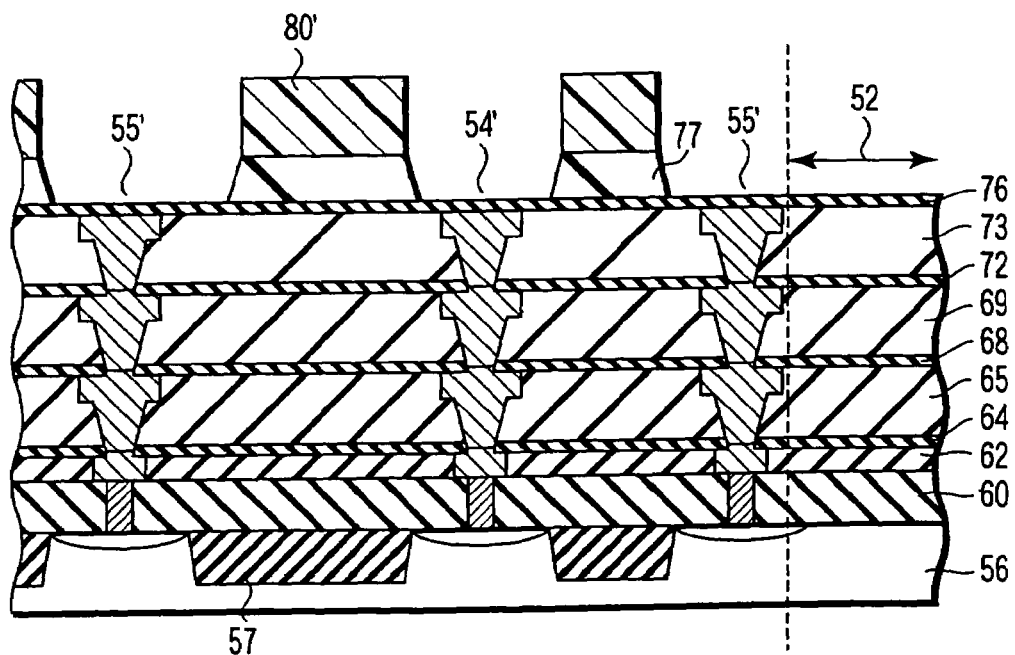
FIG. 13 is a sectional view showing one of manufacturing steps in order to explain a semiconductor device manufacturing method according to the third embodiment of the present invention.

FIGS. 12 and 13 are views for explaining a semiconductor device according to the third embodiment of the present invention. FIG. 12 is an enlarged plan view showing a chip corner. FIG. 13 is a sectional view taken along the line 13—13 in FIG. 12. Similar to the first and second embodiments, the third embodiment will exemplify a semiconductor device which is applied to a four-layered metal (Cu) interconnection LSI using a low-permittivity film as interlayer dielectric films in a multilevel interconnection.

As shown in FIG. 12, a dicing line region 52 is defined along each side of a chip 51, and an alignment mark region 53' is defined at a corner (chip end) 51A of the chip 51 at an interval Δw from each side. An alignment mark 54' formed by the uppermost metal (Cu) interconnection is formed in the alignment mark region 53'. A guard ring 55' is arranged at each chip end 51A so as to surround the alignment mark region 53'.

The structure shown in FIG. 12 can be basically formed by executing manufacturing steps as shown in FIGS. 2 to 8, etching a passivation film 77 by RIE or the like using a polyimide layer 80' having a pattern as shown in FIG. 3 as a mask, and executing a window opening step above the alignment mark 54', dicing line 52, and guard ring 55'.

In the third embodiment, as shown in FIG. 12, the alignment mark 54' is arranged at a position apart from the chip end 51A, and the guard ring 55' is arranged at a position adjacent to the chip end 51A. The guard ring 55' is so arranged as to surround the alignment mark region 53'.

The distance from the chip end 51A to the guard ring 55' is substantially 0. The guard ring 55' is arranged at a position adjacent to the dicing line 52, and electrically connected to a silicon substrate 56 (diffusion layer) via plugs (conductive members) formed by the fourth to first Cu layers and tungsten.

As shown in FIG. 13, the alignment mark 54' is arranged at a position apart from the dicing line 52, and the guard ring 55' is arranged at a position adjacent to the dicing line 52. The guard ring 55' is connected to the silicon substrate 56 via lower Cu interconnections (plugs) 75, 71, 67, and 63. This structure can physically suppress peeling which readily occurs between low-permittivity interlayer dielectric films 73, 69, 65, and 62 and thin barrier films 76, 72, 68, and 64 such as SiCN films. Since the guard ring 55' is so arranged as to surround the alignment mark region 53', peeling can be more effectively prevented than the first and second embodiments.

Although the second and third embodiments adopt both the guard ring and alignment mark, substantially the same effects can also be obtained by arranging only the guard ring.

The alignment mark has an L shape in the first to third embodiments, but can employ any other shape as far as peeling of the chip corner can be prevented. In particular, the second and third embodiments prevent peeling by the guard ring, and the guard ring can use various planar shapes such as a T shape or cross shape.

As described above, according to one aspect of this invention, an alignment mark or guard ring is arranged adjacent to the corner of a semiconductor chip, and contacts a dicing line. A plug is arranged in a lower layer in contact with the alignment mark, thereby physically reinforcing the corner of the semiconductor chip. With this structure, peeling of a low-permittivity interlayer dielectric film can be effectively prevented.

The embodiments of the present invention can provide a semiconductor device capable of suppressing peeling of an interlayer dielectric film from a chip corner upon dicing a wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor chip;
    a guard ring which is formed by part of an uppermost interconnection layer in a multilevel interconnection that is formed on the semiconductor chip and obtained by stacking low-permittivity insulating layers and interconnection layers, the guard ring being arranged adjacent to each corner of the semiconductor chip;
    a first conductive member which is buried in a first contact hole formed in the low-permittivity insulating layer below the guard ring, and contacts the guard ring;
    an alignment mark which is formed by part of the uppermost interconnection layer in the multilevel interconnection, and arranged near at least one corner of the semiconductor chip; and
    a second conductive member which is buried in a second contact hole formed in the low-permittivity insulating layer below the alignment mark, and contacts the alignment mark.

2. A device according to claim 1, wherein the first conductive member includes first plugs which are buried in contact holes formed in the respective insulating layers in the multilevel interconnection, and
    the guard ring contacts a surface of the semiconductor chip via the first plugs.

3. A device according to claim 1, wherein
    the second conductive member includes second plugs which are buried in contact holes formed in the respective insulating layers in the multilevel interconnection, and
    the alignment mark contacts a surface of the semiconductor chip via the second plugs.

4. A device according to claim 1, wherein the guard ring is arranged along four sides of the semiconductor chip.

* * * * *